United States Patent
Kung et al.

(10) Patent No.: US 8,362,804 B2
(45) Date of Patent: Jan. 29, 2013

(54) DIFFERENTIAL SIGNAL GENERATING DEVICE WITH LOW POWER CONSUMPTION

(75) Inventors: Wen-Hsia Kung, Taoyuan County (TW); Tzuo-Bo Lin, Taipei (TW); Chia-Lung Hung, Taipei County (TW); Yu-Pin Chou, Miao-Li Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 377 days.

(21) Appl. No.: 12/726,931

(22) Filed: Mar. 18, 2010

(65) Prior Publication Data

US 2010/0238159 A1 Sep. 23, 2010

(30) Foreign Application Priority Data

Mar. 20, 2009 (TW) .............................. 98109139 A

(51) Int. Cl.
*H03K 19/0175* (2006.01)
(52) U.S. Cl. .......................... 326/82; 345/214; 345/204
(58) Field of Classification Search ........... 345/204–215
See application file for complete search history.

(56) References Cited

U.S. PATENT DOCUMENTS

| | | | |
|---|---|---|---|
| 6,236,231 B1 | 5/2001 | Nguyen et al. | |
| 6,566,911 B1 | 5/2003 | Moyer | |
| 7,274,361 B2 | 9/2007 | Chang et al. | |
| 2003/0201965 A1 | 10/2003 | Sunohara et al. | |
| 2008/0117994 A1* | 5/2008 | Shetty | 375/257 |
| 2008/0180417 A1 | 7/2008 | Saeki | |

* cited by examiner

*Primary Examiner* — Shawki Ismail
*Assistant Examiner* — Jany Tran
(74) *Attorney, Agent, or Firm* — Birch, Stewart, Kolasch & Birch, LLP

(57) ABSTRACT

A differential signal generating device includes a control circuit and a differential signal driver receiving a single-ended signal. The control circuit receives a source signal and generates a control signal corresponding to a first mode when the source signal conforms with a first pre-defined state, and corresponding to a second mode when the source signal conforms with a second pre-defined state. Variations of the source signal are related to signal content of the single-ended signal. The differential signal driver is coupled to the control unit for receiving the control signal therefrom. The differential signal driver outputs a differential signal output according to the single-ended signal when the control signal corresponds to the first mode. The differential signal driver outputs a non-differential signal output when the control signal corresponds to the second mode.

17 Claims, 7 Drawing Sheets

DIFFERENTIAL SIGNAL GENERATING DEVICE WITH LOW POWER CONSUMPTION

CROSS-REFERENCE TO RELATED APPLICATION

This application claims priority of Taiwanese Application No. 098109139, filed on Mar. 20, 2009.

BACKGROUND OF THE INVENTION

1. Field of the Invention

The present invention relates to a differential signal generating device, more particularly to a differential signal generating device having low power consumption.

2. Description of the Related Art

Conventional methods for signal transmission include transmission of a single-ended signal and transmission of a differential signal. Regarding the transmission of a differential signal, a differential signal generator generates a pair of complementary signals, and outputs a differential signal in a form of a current signal having a value corresponding to the complementary signals. A differential signal receiver is capable of determining signal logic according to the differential signal outputted by the differential signal generator.

However, in some applications, the differential signal outputted by the differential signal generator is a dummy signal for the differential signal receiver during a certain duration or a certain state, i.e., the differential signal receiver does not determine the signal logic no matter what the signal content of the differential signal is. During the certain duration or the certain state, the differential signal still causes power consumption of the differential signal receiver, and such power consumption is unnecessary and wasted.

SUMMARY OF THE INVENTION

Therefore, an object of the present invention is to provide a differential signal generating device having low power consumption.

Accordingly, a differential signal generating device of the present invention is adapted for providing one of a differential signal output and a non-differential signal output according to a source signal and a single-ended signal. Variations of the source signal are related to signal content of the single-ended signal. The differential signal generating device comprises a control circuit and a differential signal driver.

The control circuit includes a detecting unit for receiving the source signal and generating a detection result that indicates whether the source signal conforms with a first pre-defined state or a second pre-defined state, and a control unit coupled to the detecting unit for receiving the detection result therefrom and for generating a control signal. The control signal corresponds to a first mode when the detection result indicates that the source signal conforms with the first pre-defined state, and corresponds to a second mode when the detection result indicates that the source signal conforms with the second pre-defined state.

The differential signal driver is coupled to the control unit for receiving the control signal therefrom. The differential signal driver further receives the single-ended signal and has two output ends. The differential signal driver generates a pair of complementary signals according to the single-ended signal, and outputs the differential signal output at the output ends according to the complementary signals when the control signal corresponds to the first mode. The differential signal driver outputs the non-differential signal output when the control signal corresponds to the second mode.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
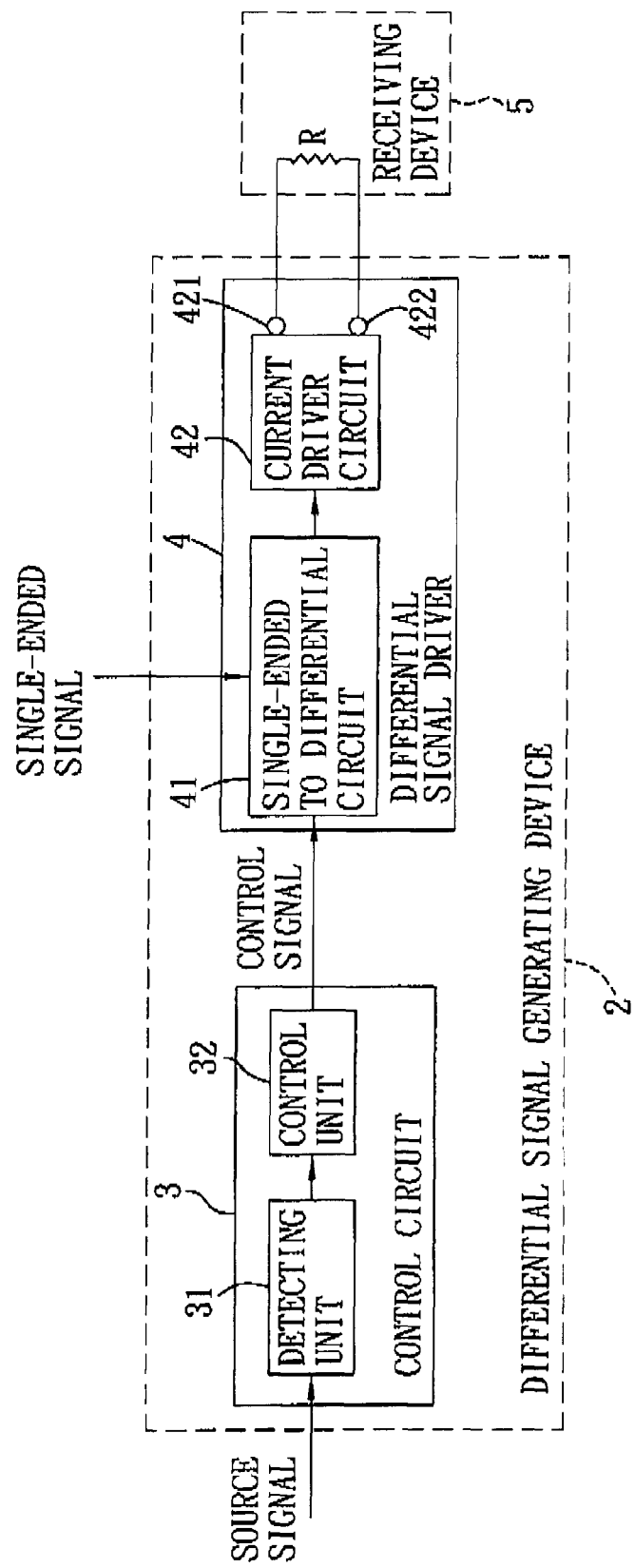
FIG. 1 is a schematic circuit block diagram of a first preferred embodiment of a differential signal generating device of the present invention.

Referring to FIG. 1, a first preferred embodiment of a differential signal generating device 2 of the present invention is adapted to be coupled to a resistor (R) of a receiving device 5, and includes a control circuit 3 and a differential signal driver 4. The control circuit 3 includes a detecting unit 31 for receiving a source signal, and a control unit 32 coupled to the detecting unit 31. The differential signal driver 4 includes a single-ended to differential circuit 41 coupled to the control unit 32 of the control circuit 3 and adapted for receiving a single-ended signal, and a current driver circuit 42 coupled to the single-ended to differential circuit 41. The current driver circuit 42 has a pair of output ends 421, 422 coupled two opposite ends of the resistor (R), respectively.

Figure 2:
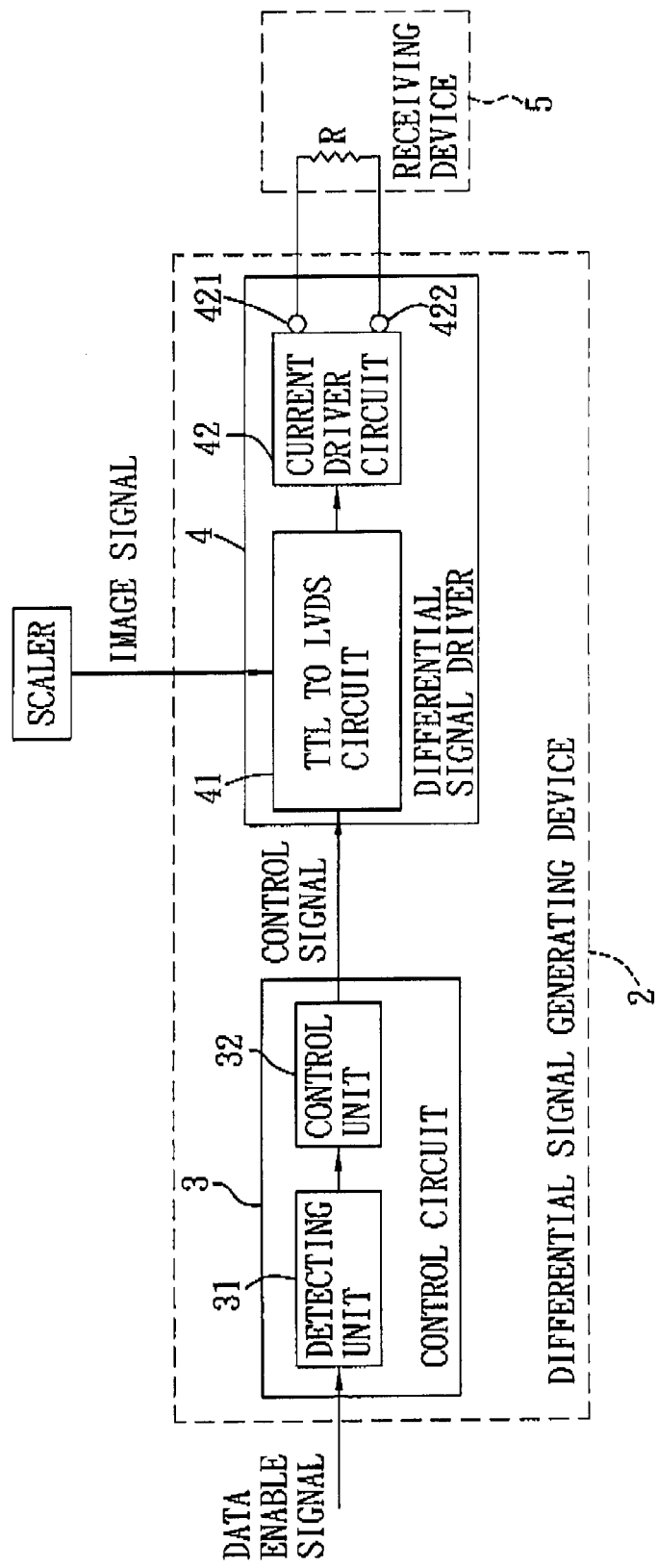
FIG. 2 is a schematic circuit block diagram illustrating an example where the first preferred embodiment is applied to a display apparatus.

The differential signal generating device 2 of this embodiment is adapted to be used in various equipments, and is illustrated by an application to a display apparatus in the following. Referring to FIG. 2, the differential signal generating device 2 is disposed in a control module of the display apparatus, and the receiving device 5 is disposed in a driving module of the display apparatus. In this application, the single-ended to differential circuit of the differential signal driver 4 is a transistor-transistor logic (TTL) to low-voltage differential signal (LVDS) circuit 41. The source signal is a data enable signal from the display apparatus, and the single-ended signal is a RGB image signal in a form of TTL signal from a scaler of the display apparatus.

Figure 3:
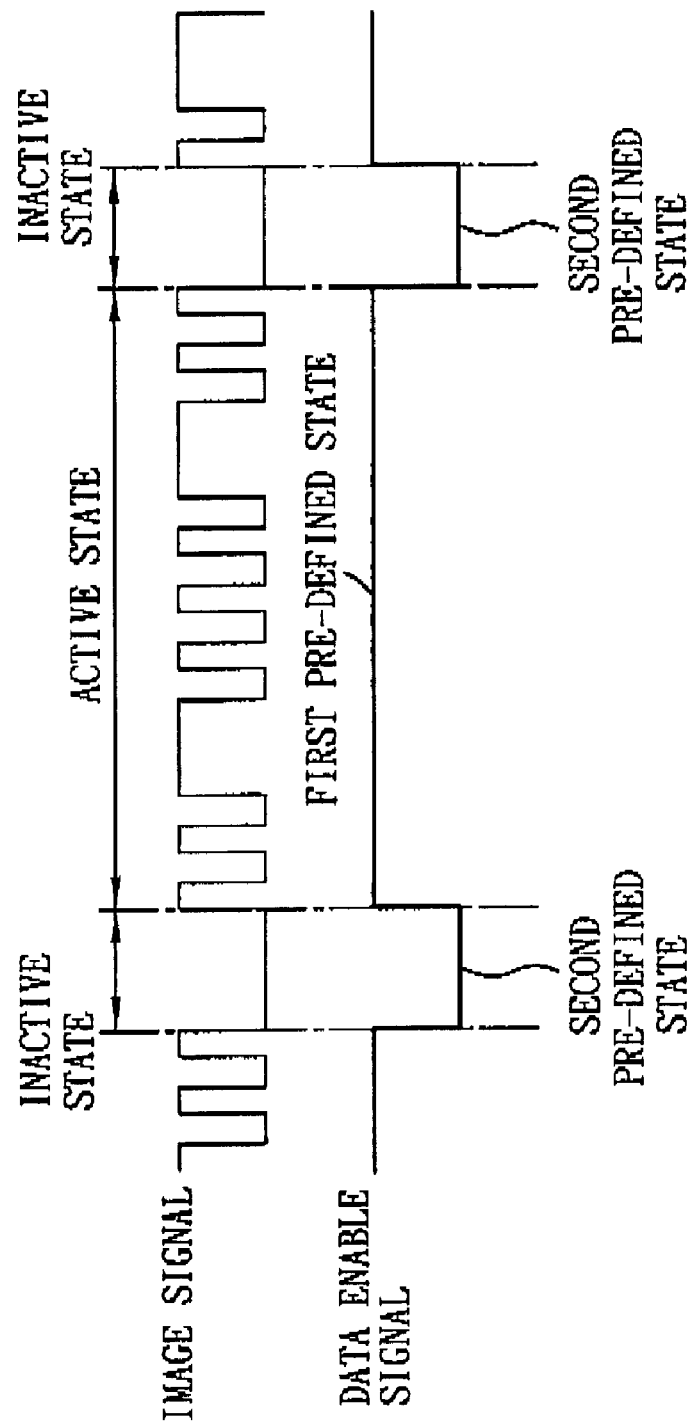
FIG. 3 is a timing diagram illustrating a data enable signal corresponding to an image signal and indicating whether the image signal is in an active state or an inactive state.

Referring to FIG. 3, it is well known that the data enable signal corresponds to the image signal and indicates whether or not the image signal is one that enables display of images on a screen of the display apparatus. The image signal enables display of images on the screen when it is in an active state, and cannot enable display of images on the screen when it is in an inactive state. Therefore, the data enable signal conforms with a first pre-defined state when the data enable signal indicates that the image signal is in the active state, and conforms with a second pre-defined state when the data enable signal indicates that image signal is in the inactive state.

Referring again to FIG. 2 again, the detecting unit 31 of the control circuit 3 detects variations (level variations in this embodiment) of the data enable signal and generates a detection result. The control unit 32 of the control circuit 3 receives the detection result from the detecting unit 31, and generates a control signal corresponding to a first or a second mode. Particularly, the control unit 32 generates the control signal corresponding to the first mode when the detection result indicates that the data enable signal conforms with the first pre-defined state (i.e., the data enable signal has a high level), and corresponding to the second mode when the detection result indicates that the source signal conforms with the second pre-defined state (i.e., the data enable signal has a low level).

Figure 4:
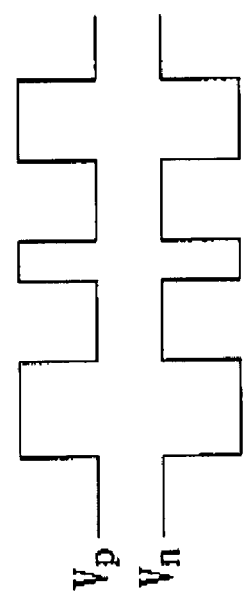
FIG. 4 illustrates a pair of complementary signals generated by a single-ended to differential circuit of the differential signal generating device.

Further referring to FIG. 4, the TTL to LVDS circuit 41 generates a pair of complementary signals ($V_p$, $V_n$) according to the image signal when the control signal corresponds to the first mode. The current driver circuit 42 receives the complementary signals ($V_p$, $V_n$), and outputs the differential signal output at the output ends 421, 422 in a form of a current signal having a value (I or –I) corresponding to the complementary signals ($V_p$, $V_n$). The receiving device 5 receives the differential signal output from the differential signal generating device 2 through the output ends 421, 422, and determines whether the differential signal output indicates logic 0 or logic 1 according to a direction of the current passing through the resistor (R). For example, the TTL to LVDS circuit 41 generates the complementary signal ($V_p$) having high potential, and the complementary signal ($V_n$) having zero potential when the differential signal output indicating logic 1 is desired. The current driver circuit 42 outputs the differential signal output in a form of a current signal having a value (I) corresponding to the complementary signals ($V_p$, $V_n$). On the other hand, the TTL to LVDS circuit 41 generates the complementary signal ($V_p$) having zero potential, and the complementary signal ($V_n$) having high potential when the differential signal output indicating logic 0 is desired. The current driver circuit 42 outputs the differential signal output in a form of a current signal having a value (–I) corresponding to the complementary signals ($V_p$, $V_n$).

Figure 5:
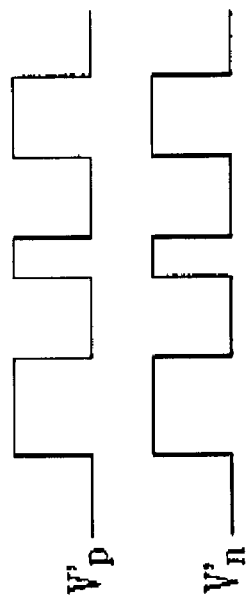
FIG. 5 illustrates a pair same potential signals generated by the single-ended to differential circuit.

Referring to FIGS. 2 and 5, the TTL to LVDS circuit 41 generates a pair of same potential signals ($V_p'$, $V_n'$) both of which have high potential or zero potential according to the image signal when the control signal corresponds to the second mode. The current driver circuit 92 receives the same potential signals ($V_p'$, $V_s'$), and outputs the non-differential signal output in a form of a current signal having a substantial zero value or a negligible value by causing the potentials at the output ends 421, 922 to be substantially the same in accordance with the same potential signals. Therefore, little or is no current passes through the resistor (R) to thereby avoid unnecessary power consumption.

The control signal corresponds to the first mode when the image signal is in the active state, and corresponds to the second mode when the image signal is in the inactive state. Therefore, the differential signal generating device 2 results in low power consumption of the receiving device 5 without affecting accuracy and completeness of data transmission.

Figure 6:
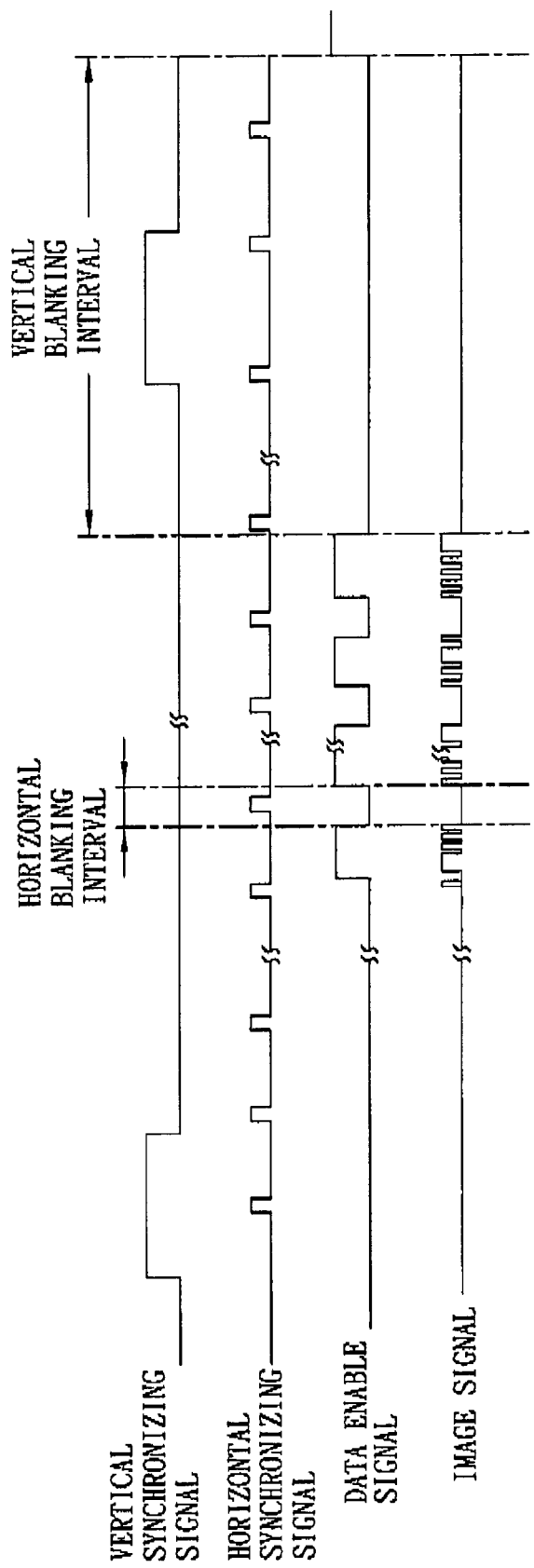
FIG. 6 is a timing diagram illustrating relations among vertical and horizontal synchronizing signals, the data enable signal, and the image signal, and indicating vertical and horizontal blanking intervals.

Referring to FIG. 6, it is well known that the data enable signal is related to two driving signals, i.e., vertical and horizontal synchronizing signals, from the display apparatus. The screen displays a new image when the vertical synchronizing signal is active. When the image displayed on the screen is refreshed, the image signal is in the inactive state, and the data enable signal has the low level. Therefore, the screen displays nothing during this process called as a vertical blanking interval. Moreover, the horizontal synchronizing signal scans one line of the screen when it is active, and the process of scanning from one line to another includes a horizontal blanking interval. During the horizontal blanking interval, the image signal is also in the inactive state, and the data enable signal also has the low level. It is noted that the differential signal driver 4 (shown in FIG. 2) outputs the non-differential signal output in a form of a current signal having a substantially zero value or a negligible value during the vertical and horizontal blanking intervals to thereby avoid unnecessary power consumption.

Regarding a screen with a resolution of 1920×1200 (i.e., 1200 active lines and 1920 active pixels in each line), a number of total lines of the screen is 1245, and a number of total pixels of each line is 2592. The difference between the total lines and the active lines is associated with the vertical blanking interval, and the difference between the total pixels and the active pixels in each line is associated with the horizontal blanking interval. During the vertical blanking interval, the power consumption of the display apparatus provided with the differential signal generating device 2 of this invention is 96.4% of that of a conventional display apparatus. Moreover, the power consumption of the display apparatus provided with the differential signal generating device 2 is 71.4% of that of the conventional display apparatus when the non-differential signal output is outputted during both the vertical and horizontal blanking intervals.

Aside from the above-mentioned application to the display apparatus, this embodiment is also adapted for signal transmission between an electronic device and a display apparatus. For example, the differential signal generating device 2 can be incorporated in a graphics card disposed in a host device of a computer, and provides a differential or non-differential signal to a display apparatus coupled to the graphics card through a transmission line. Moreover, the differential signal generating device 2 of this invention is adapted for any interface (such as DisplayPort, High-Definition Multimedia Interface, Reduced Swing Differential Signaling, LVDS, mini-LVDS, etc.), system, electronic device, chip, etc. that uses a differential signal. Accordingly, the single-ended to differential circuit is not limited to the TLL to LVDS circuit, the source signal is not limited to the data enable signal, and the single-ended signal is not limited to the RGB image signal in other applications of this invention.

It should be noted that the source signal may be a periodic source signal or a non-periodic source signal. The control signal has a period of switching between the first and second modes that is substantially fixed when the source signal is the periodic source signal.

Figure 7:
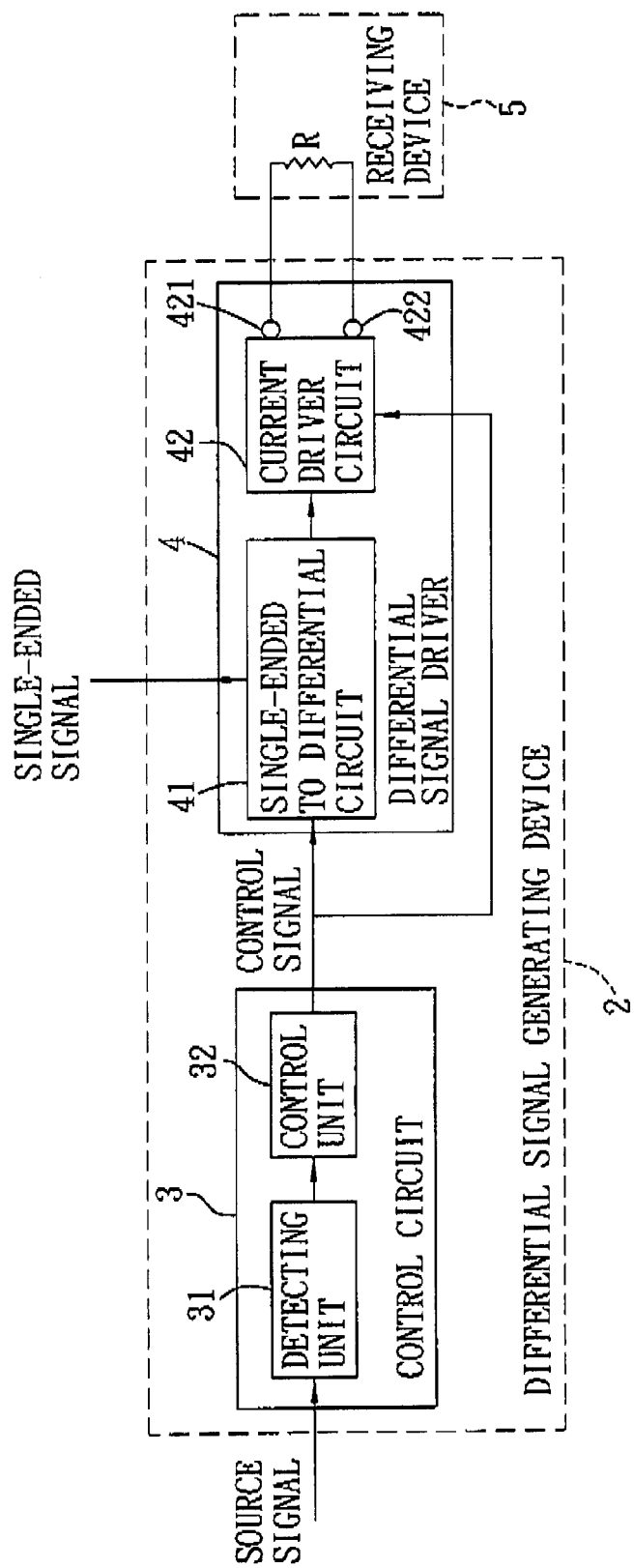
FIG. 7 is a schematic circuit block diagram of a second preferred embodiment of a differential signal generating device of the present invention.

Referring to FIG. 7, a second preferred embodiment of the differential signal generating device 2 of this invention is shown to be similar to the first preferred embodiment. In this embodiment, the single-ended to differential circuit 91 generates a pair of arbitrary signals, such as the complementary signals or the same potential signals, when the control signal corresponds to the second mode. Moreover, the current driver circuit 42 of the differential signal driver 4 is further coupled to the control unit 32 of the control circuit 3 for receiving the control signal therefrom. When the control signal corresponds to the second mode, the current driver circuit 42 further causes the output ends 421, 422 to be in a high-impedance state in a known manner (see, for example, U.S. Pat. Nos. 6,566,911 and 7,274,361), and outputs the non-differential signal output in a form of a current signal having a substantially zero value or a negligible value while the output ends 421, 422 are in the high-impedance state. The object of low power consumption can be also achieved via this embodiment.

Figure 8:
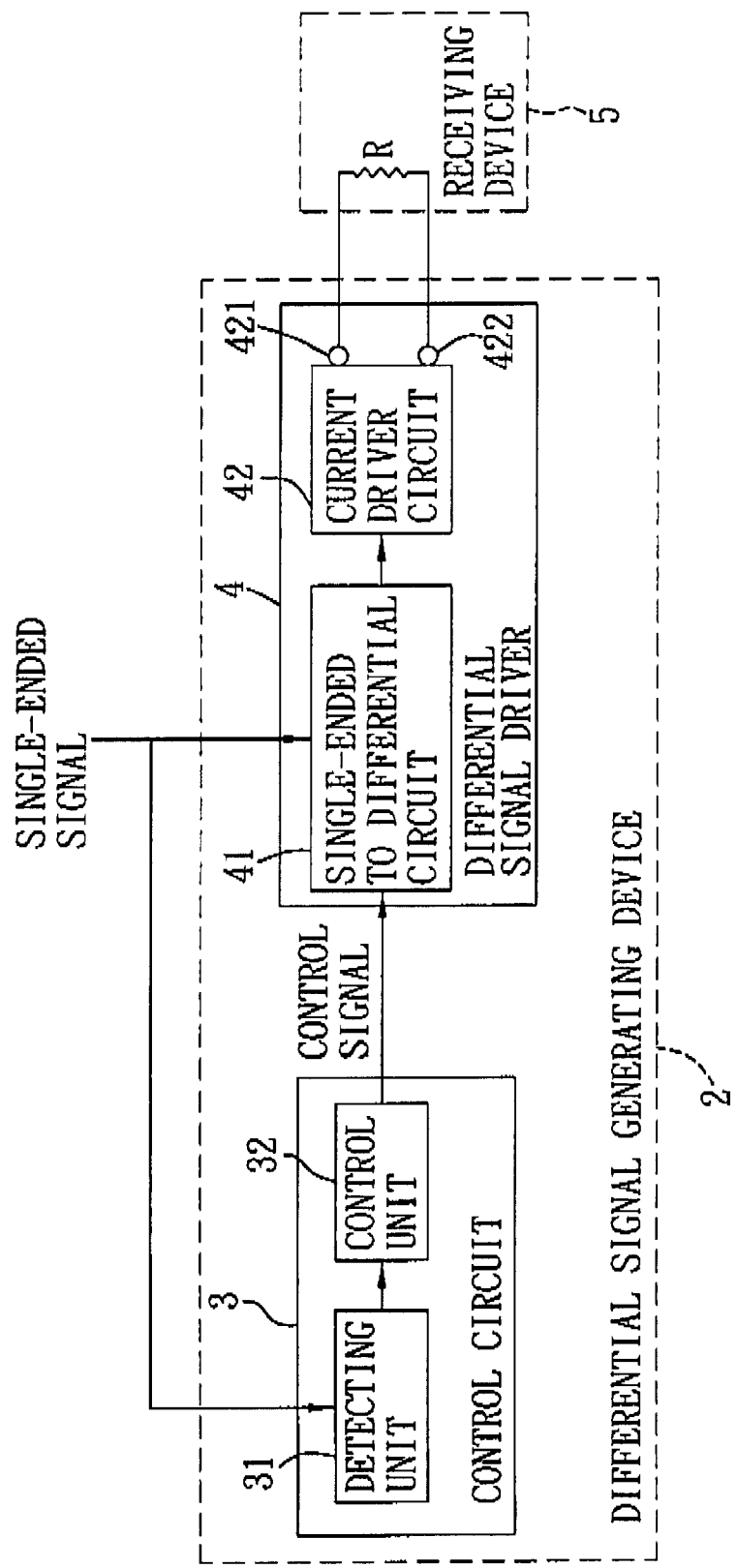
FIG. 8 is a schematic circuit block diagram of a third preferred embodiment of a differential signal generating device of the present invention.

Referring to FIG. 8, a third preferred embodiment of the differential signal generating device 2 of this invention is shown to be similar to the first and second preferred embodiments. In this embodiment, the source signal detected by the detecting unit 31 is the single-ended signal received by the single-ended to differential circuit 41, i.e., the source signal and the single-ended signal are the same signal. For example, when the single-ended signal presents a predetermined bit pattern (e.g., 010101), the single-ended signal conforms with the first pre-defined state, and the control circuit 3 generates the control signal corresponding to the first mode. Otherwise, the single-ended signal conforms with the second pre-defined state, and the control circuit 3 generates the control signal corresponding to the second mode.

In sum, the differential signal generating device 2 is capable of providing the non-differential signal output when appropriate to thereby avoid unnecessary power consumption of the receiving device 5 without affecting the accuracy and the completeness of data transmission.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A differential signal generating device, for providing one of a differential signal output and a non-differential signal output according to a source signal and a single-ended signal, variations of the source signal being related to signal content of the single-ended signal, the differential signal generating device comprising:
   a control circuit, for receiving the source signal, for generating a detection result that indicates whether the source signal conforms with a first pre-defined state or a second pre-defined state, and for generating a control signal corresponding to a first mode when the detection result indicates that the source signal conforms with the first pre-defined state and corresponding to a second mode when the detection result indicates that the source signal conforms with the second pre-defined state; and
   a differential signal driver coupled to the control circuit for receiving the control signal therefrom, the differential signal driver further receiving the single-ended signal and comprising two output ends, wherein the differential signal driver generates a pair of complementary signals according to the single-ended signal, and outputs the differential signal output at the output ends according to the complementary signals when the control signal corresponds to the first mode, and wherein the differential signal driver outputs the non-differential signal output when the control signal corresponds to the second mode, wherein the control circuit comprises:
      a detecting unit, for receiving the source signal and generating the detection result; and
      a control unit, coupled to the detecting unit for receiving the detection result therefrom and generating the control signal.

2. The differential signal generating device as claimed in claim 1, wherein the differential signal driver generates a pair of same potential signals, and outputs the non-differential signal output according to the same potential signals when the control signal corresponds to the second mode.

3. The differential signal generating device as claimed in claim 2, wherein the differential signal driver includes:
   a single-ended to differential circuit, coupled to the control unit of the control circuit for receiving the control signal therefrom, the single-ended to differential circuit generating the complementary signals according to the single-ended signal when the control signal corresponds to the first mode, and generating the same potential signals when the control signal corresponds to the second mode; and
   a current driver circuit, coupled to the single-ended to differential circuit, wherein the current driver circuit outputs the differential signal output in a form of a current signal having a value corresponding to the complementary signals when the control signal corresponds to the first mode, and wherein the current driver circuit outputs the non-differential signal output in a form of a current signal having a negligible value by causing the potentials at the output ends to be substantially the same in accordance with the same potential signals when the control signal corresponds to the second mode.

4. The differential signal generating device as claimed in claim 1, wherein the differential signal driver causes the output ends to be in a high-impedance state and outputs the non-differential signal output when the control signal corresponds to the second mode.

5. The differential signal generating device as claimed in claim 4, wherein the differential signal driver comprises:
   a single-ended to differential circuit, coupled to the control unit of the control circuit for receiving the control signal therefrom, the single-ended to differential circuit generating the complementary signals according to the single-ended signal when the control signal corresponds to the first mode; and
   a current driver circuit coupled to the single-ended to differential circuit, wherein the current driver circuit outputs the differential signal output in a form of a current signal having a value corresponding to the complementary signals when the control signal corresponds to the first mode, and wherein the current driver circuit causes the output ends to be in the high-impedance state and outputs the non-differential signal output in a form of a current signal having a negligible value when the control signal corresponds to the second mode.

6. The differential signal generating device as claimed in claim 1, the source signal being a data enable signal used to indicate whether or not the single-ended signal is one that enables display of images on a screen, wherein the source signal conforms with the first pre-defined state when the data enable signal indicates that the single-ended signal is one that enables display of images on a screen, and conforms with the second pre-defined state when otherwise.

7. A differential signal generating device, for providing one of a differential signal output and a non-differential signal output according to a periodic source signal and a single-ended signal, the differential signal generating device comprising:
   a control circuit, for receiving the source signal, for generating a detection result that indicates whether the source signal conforms with a first pre-defined state or a second pre-defined state, and for generating a control signal corresponding to a first mode when the detection result indicates that the source signal conforms with the first pre-defined state and corresponding to a second mode when the detection result indicates that the source signal conforms with the second pre-defined state; and a differential signal driver, coupled to the control unit for receiving the control signal therefrom, the differential signal driver further receiving the single-ended signal and comprising two output ends, wherein the differential signal driver generates a pair of complementary signals according to the single-ended signal, and outputs the differential signal output at the output ends according to the complementary signals when the control signal corresponds to the first mode, and wherein the differential signal driver outputs the non-differential signal output when the control signal has the second mode; wherein the control signal has a period of switching between the first and second modes that is substantially fixed, wherein the control circuit comprises:
a detecting unit for receiving the source signal and generating the detection result; and
a control unit coupled to the detecting unit for receiving the detection result therefrom and generating the control signal.

8. The differential signal generating device as claimed in claim 7, wherein the differential signal driver generates a pair of same potential signals, and outputs the non-differential signal output according to the same potential signals when the control signal corresponds to the second mode.

9. The differential signal generating device as claimed in claim 8, wherein the differential signal driver includes:
a single-ended to differential circuit coupled to the control unit of the control circuit for receiving the control signal therefrom, the single-ended to differential circuit generating the complementary signals according to the single-ended signal when the control signal corresponds to the first mode, and generating the same potential signals when the control signal corresponds to the second mode; and
a current driver circuit, coupled to the single-ended to differential circuit, wherein the current driver circuit outputs the differential signal output in a form of a current signal having a value corresponding to the complementary signals when the control signal has the first mode, and wherein the current driver circuit outputs the non-differential signal output in a form of a current signal having a negligible value by causing the potentials at the output ends to be substantially the same in accordance with the same potential signals when the control signal corresponds to the second mode.

10. The differential signal generating device as claimed in claim 8, wherein the differential signal generating device is disposed in a control module of a display apparatus, and wherein when the source signal is during a vertical blanking interval, the differential signal generating device operates in the second mode.

11. The differential signal generating device as claimed in claim 8, wherein the differential signal generating device is disposed in a control module of a display apparatus, and wherein when the source signal is during a horizontal blanking interval, the differential signal generating device operates in the second mode.

12. The differential signal generating device as claimed in claim 7, wherein the differential signal driver causes the output ends to be in a high-impedance state and outputs the non-differential signal output when the control signal corresponds to the second mode.

13. The differential signal generating device as claimed in claim 12, wherein the differential signal driver comprises:
a single-ended to differential circuit coupled to the control unit of the control circuit for receiving the control signal therefrom, the single-ended to differential circuit generating the complementary signals according to the single-ended signal when the control signal corresponds to the first mode; and
a current driver circuit, coupled to the single-ended to differential circuit, wherein the current driver circuit outputs the differential signal output in a form of a current signal having a value corresponding to the complementary signals when the control signal corresponds to the first mode, and wherein the current driver circuit causing the output ends to be in the high-impedance state and outputs the non-differential signal output in a form of a current signal having a negligible value when the control signal corresponds to the second mode.

14. The differential signal generating device as claimed in claim 12, wherein the differential signal generating device is disposed in a control module of a display apparatus, and wherein when the source signal is during a vertical blanking interval, the differential signal generating device operates in the second mode.

15. The differential signal generating device as claimed in claim 12, wherein the differential signal generating device is disposed in a control module of a display apparatus, and wherein when the source signal is during a horizontal blanking interval, the differential signal generating device operates in the second mode.

16. The differential signal generating device as claimed in claim 7, the source signal being a data enable signal used to indicate whether or not the single-ended signal is one that enables display of images on a screen, wherein the source signal conforms with the first pre-defined state when the data enable signal indicates that the single-ended signal is one that enables display of images on a screen, and conforms with the second pre-defined state when otherwise.

17. The differential signal generating device as claimed in claim 7, the source signal and the single-ended signal being the same signal, wherein the source signal conforms with the first pre-defined state when the source signal presents a predetermined bit pattern, and conforms with the second pre-defined state when otherwise.

* * * * *